(12) United States Patent
Tuccillo (10) Patent No.: US 8,331,874 B2
(45) Date of Patent: Dec. 11, 2012

(54) WIRELESS TRANSMITTER

(75) Inventor: Mark Joseph Tuccillo, Southington, CT (US)

(73) Assignee: Ivy Biomedical Systems, Inc., Branford, CT (US)

( * ) Notice: Subject to any disclaimer, the term of this patent is extended or adjusted under 35 U.S.C. 154(b) by 590 days.

(21) Appl. No.: 12/546,279

(22) Filed: Aug. 24, 2009

(65) Prior Publication Data

US 2009/0311970 A1    Dec. 17, 2009

Related U.S. Application Data

(62) Division of application No. 11/206,278, filed on Aug. 12, 2005, now Pat. No. 7,595,697.

(60) Provisional application No. 60/672,562, filed on Apr. 18, 2005, provisional application No. 60/671,935, filed on Apr. 15, 2005.

(51) Int. Cl.
*H04B 1/38* (2006.01)

(52) U.S. Cl. .......................................... 455/73

(58) Field of Classification Search .............. 455/73
See application file for complete search history.

(56) References Cited

U.S. PATENT DOCUMENTS

| | | | |
|---|---|---|---|
| 3,761,831 A | 9/1973 | Foerster | |
| 4,353,372 A | 10/1982 | Ayer | |
| 4,588,956 A | 5/1986 | de Corlieu et al. | |
| 4,659,872 A | 4/1987 | Dery et al. | |
| 4,803,701 A | 2/1989 | Rhodes | |
| 4,951,672 A | 8/1990 | Buchwald et al. | |
| 4,991,580 A | 2/1991 | Moore | |
| 5,206,602 A * | 4/1993 | Baumgartner et al. | 330/9 |
| 5,217,010 A | 6/1993 | Tsitlik et al. | |
| 5,228,450 A | 7/1993 | Sellers | |
| 5,515,012 A * | 5/1996 | Bhushan et al. | 331/17 |
| 5,530,701 A | 6/1996 | Stillman et al. | |
| 5,855,550 A | 1/1999 | Lai et al. | |
| 5,862,803 A | 1/1999 | Besson et al. | |
| 6,032,063 A | 2/2000 | Hoar et al. | |

(Continued)

FOREIGN PATENT DOCUMENTS

EP    0836864    4/1998

(Continued)

OTHER PUBLICATIONS

PCT International Search Report and Written Opinion of International Searching Authority for International Patent Application No. PCT/US2006/013616, mailed Aug. 9, 2006, 7 pages.

(Continued)

*Primary Examiner* — Matthew Anderson
*Assistant Examiner* — David Bilodeau
(74) *Attorney, Agent, or Firm* — K&L Gates LLP (57) ABSTRACT

A magnetic field tolerant amplifier having an amplifier stage, a differential to single-ended output amplifier stage and a first and second delay line. In another embodiment the invention relates to a magnetic gradient cancellation delay line including two coils connected in series at a junction and non-inductively wound to cancel induced currents from magnetic gradient. In another embodiment the invention relates to a patient lead including a flexible circuit substrate having a flexible conductor having distributed impedance. In still yet another embodiment the invention relates to a wireless transceiver system including an RF cancellation delay line; a differential amplifier stage; a differential to single ended output amplifier stage; an A/D converter; an RF transceiver and an antenna.

3 Claims, 10 Drawing Sheets

U.S. PATENT DOCUMENTS

| | | | |
|---|---|---|---|
| 6,052,614 | A | 4/2000 | Morris et al. |
| 6,091,296 | A | 7/2000 | Rha |
| 6,100,769 | A | 8/2000 | An et al. |
| 6,640,246 | B1 | 10/2003 | Gary, Jr. et al. |
| 6,897,788 | B2 | 5/2005 | Khair et al. |
| 7,088,233 | B2 | 8/2006 | Menard |
| 7,373,091 | B2 | 5/2008 | Moeller |
| 7,595,697 | B2 | 9/2009 | Tuccillo |
| 2002/0013518 | A1* | 1/2002 | West et al. .................. 600/300 |
| 2002/0161308 | A1 | 10/2002 | Matsumura |
| 2003/0174049 | A1 | 9/2003 | Beigel et al. |
| 2004/0077961 | A1 | 4/2004 | Yonce |
| 2004/0176674 | A1 | 9/2004 | Nazeri |
| 2004/0176675 | A1 | 9/2004 | Rice et al. |

FOREIGN PATENT DOCUMENTS

| | | |
|---|---|---|
| JP | 07029430 | 1/1995 |
| JP | 2002-271149 | 9/2002 |

OTHER PUBLICATIONS

Brunner et al., "Prototype Ventilator and Alarm Algorithm for the NASA Space Station," *Journal of Clinical Monitoring*, 5(2):90-99 (1989).

Shabot, "Standardized acquisition of bedside data: The IEEE P1073 medical information bus," *International Journal of Clinical Monitoring and Computing*, 6:197-204 (1989).

Silvern et al., "Ventilator Risk Management Using a Programmed Monitor," *Journal of Clinical Engineering*, 14(3):217-224 (May/Jun. 1989)

Invitation to Pay Additional Fees and Preliminary Search Report of International Searching Authority, Feb. 27, 2007.

International Search Report & Written Opinion of International Searching Authority, Jun. 5, 2007.

\* cited by examiner

```
// SERIAL NUMBER
//     4 bytes (long)
    0x00, 0x00, 0x00, 0x01
// ----------------------------------------------------------------
// DEVICE TYPE
//     1 byte ? 0=RX, 1=TX
    xx, // ----------------------------------------------------------------
// DEVICE ID
//     1 byte:
//     0x00: TEST
//     0x01: 1 channel ECG
//     0x02: 2 channel ECG, SPO2
//     0x03: 3 channel ECG, P1
//     0x04: 4 channel ECG, P1, P2, SPO2
// 0x05: 2 channel ECG1, ECG2
//     0x06 - 0xff: TBD
    xx // ----------------------------------------------------------------
// FIRMWARE VERSION
//     4 byte string: "1.00" or any 4 byte ascii chars
    '1', '.', '0', '0',
// ----------------------------------------------------------------
// Report Interval
//     00: Reports only when new data available (not allowed in current firmware)
//     xx: Number of MS xx,
// ----------------------------------------------------------------
//     data_protocol
//
//     00: NO ACK
// 01: ACK with retry
//
    xx,
// ----------------------------------------------------------------
// REPORT BYTES
//     Number of bytes in data report
    xx
```

FIG. 5

```
struct wordorbyte
(
union (
        unsigned int word;
        struct (
                unsigned char h;
                unsigned char l;
        ) bytes;
    ) dat;
);

struct txbuf_struct
(
unsigned int ecg;               // 2 ecg
unsigned char key;              // 1 byte for ident id
struct wordorbyte payload;      // 2
);                              // 5 bytes TX total const struct descriptor_struct code descriptor_msg =
(
// ----------------------------------------------------------
// SERIAL NUMBER
//      4 bytes (long)
    0x00, 0x00, 0x00, 0x01
// ----------------------------------------------------------
// DEVICE TYPE
//      1 byte ? 0=RX, 1=TX
    0x01, // ----------------------------------------------------------
// DEVICE ID
//      1 byte:
//      0x00: TEST
//      0x01: 1 channel ECG
//      0x02: 2 channel ECG, SPO2
//      0x03: 3 channel ECG, P1
//      0x04: 4 channel ECG, P1, P2, SPO2
//      0x05 - 0xff: TBD
//   0x04,       // 4 channel ECG, P1, P2, SPO2

// ----------------------------------------------------------
// FIRMWARE VERSION
//      4 byte string: "1.00" or any 4 byte ascii chars
    '1', '.', '0', '0',
// ----------------------------------------------------------
// Report Interval
```

CONTINUE
FROM FIG. 6A

```
//      00: Reports only when new data available (not allowed in current firmware)
//      xx: Number of MS 3,
// ----------------------------------------------------------------
//      data_protocol
//
//      00: NO ACK
//      01: ACK with retry
//
   0x01,
// ----------------------------------------------------------------
// REPORT BYTES
//      Number of bytes in data report
   5,
// ----------------------------------------------------------------
// REPORT DESCRIPTOR IDs
//        ID bytes will be used for each byte in the report
//        0x00 - ECG HIGH BYTE (vector 1)
//        0x01 - ECG LOW BYTE (vector 1)
//        0x02 - Pressure Channel 1 HIGH byte
//        0x03 - Pressure Channel 1 LOW byte
//        0x04 - Pressure Channel 2 HIGH byte
//        0x05 - Pressure Channel 2 LOW byte
//        0x06 - Pressure Channel 3 HIGH byte
//        0x07 - Pressure Channel 3 LOW byte
//        0x08 - Pressure Channel 4 HIGH byte
//        0x09 - Pressure Channel 4 LOW byte
//        0x0a - ECG HIGH BYTE (vector 2)
//        0x0b - ECG LOW BYTE (vector 2)
//        0x0c - Combo: RETRY upper nibble, Packet Count lower nibble
//
//        0x - RESERVED FOR FUTURE USE
//
//         0xf9 - round robin ID byte
//        0xfa - Packet retry num
//        0xfb - checksum byte high
//        0xfc - checksum byte low
//        0xfd - LENGTH byte
//        0xfe - Packet number byte
//        0xff - mixed DATA type: used in round robin packets
// ----------------------------------------------------------------
//   0x00,      // ECG1 HIGH
//   0x01,      // ECG1 LOW
//   0xf9,      // Round Robin ID byte
//   0xff,      // Mixed data type
//   0xff,      // Mixed data type
);
```

FIG. 6B

```
struct txbuf_struct
(
unsigned int ecg (9);          // 18 packed bytes of ecg data
unsigned char status;          // 1 byte status
);                             // 19 bytes TX total const struct descriptor_struct code descriptor_msg =
(
// ----------------------------------------------------------------
// SERIAL NUMBER
//     4 bytes (long)
    0x00, 0x00, 0x00, 0x01
// ----------------------------------------------------------------
// DEVICE TYPE
//     1 byte ? 0=RX, 1=TX
    0x01, // ----------------------------------------------------------------
// DEVICE ID
//     1 byte:
//     0x00: TEST
//     0x01: 1 channel ECG
//     0x02: 2 channel ECG, SPO2
//     0x03: 3 channel ECG, P1
//     0x04: 4 channel ECG, P1, P2, SPO2
//     0x05 - 0xff: TBD
// 0x01,        //      0x01: 1 channel ECG // ----------------------------------------------------------------
// FIRMWARE VERSION
//     4 byte string: "1.00" or any 4 byte ascii chars
    '1', '.', '0', '0',
// ----------------------------------------------------------------
// Report Interval
//     00: Reports only when new data available (not allowed in current firmware)
//     xx: Number of MS 3,
// ----------------------------------------------------------------
//     data_protocol
//
//     00: NO ACK
// 01: ACK with retry
//
    0x01,
// ----------------------------------------------------------------
// REPORT BYTES
```

CONTINUE
FROM FIG. 7A
//     Number of bytes in data report
    19,
// ------------------------------------------------------------------------
// REPORT DESCRIPTOR IDs
//     ID bytes will be used for each byte in the report
//     0x00 - ECG HIGH BYTE (vector 1)
//     0x01 - ECG LOW BYTE (vector 1)
//     0x02 - Pressure Channel 1 HIGH byte
//     0x03 - Pressure Channel 1 LOW byte
//     0x04 - Pressure Channel 2 HIGH byte
//     0x05 - Pressure Channel 2 LOW byte
//     0x06 - Pressure Channel 3 HIGH byte
//     0x07 - Pressure Channel 3 LOW byte
//     0x08 - Pressure Channel 4 HIGH byte
//     0x09 - Pressure Channel 4 LOW byte
//     0x0a - ECG HIGH BYTE (vector 2)
//     0x0b - ECG LOW BYTE (vector 2)
//     0x0c - Combo: RETRY upper nibble, Packet Count lower nibble
//     0x0D - STATUS BYTE
//     0x0e - PACKED ECG data (MRI/CAT SCANNER APP)
//     0x - RESERVED FOR FUTURE USE
//
//     0xf9 - round robin ID byte
//     0xfa - Packet retry num
//     0xfb - checksum byte high
//     0xfc - checksum byte low
//     0xfd - LENGTH byte
//     0xfe - Packet number byte
//     0xff - mixed DATA type: used in round robin packets
// ------------------------------------------------------------------------
    0x0e,     // packed ECG data byte 1
    0x0e,     // packed ECG data byte 2
    0x0e,     // packed ECG data byte 3
    0x0e,     // packed ECG data byte 4
    0x0e,     // packed ECG data byte 5
    0x0e,     // packed ECG data byte 6
    0x0e,     // packed ECG data byte 7
    0x0e,     // packed ECG data byte 8
    0x0e,     // packed ECG data byte 9
    0x0e,     // packed ECG data byte 10
    0x0e,     // packed ECG data byte 11
    0x0e,     // packed ECG data byte 12
    0x0e,     // packed ECG data byte 13
    0x0e,     // packed ECG data byte 14
    0x0e,     // packed ECG data byte 15
    0x0e,     // packed ECG data byte 16
    0x0e,     // packed ECG data byte 17
    0x0e,     // packed ECG data byte 18
    0x0d,     // STATUS byte
);

FIG. 7B

```
struct txbuf_struct
(
unsigned int ecg (9);         // 18 packed bytes of ecg data
unsigned char status;         // 1 byte status
);                            // 19 bytes TX total const struct descriptor_struct code descriptor_msg =
(
// ------------------------------------------------------------
// SERIAL NUMBER
//      4 bytes (long)
    0x00, 0x00, 0x00, 0x01
// ------------------------------------------------------------
// DEVICE TYPE
//      1 byte ? 0=RX, 1=TX
    0x01, // ------------------------------------------------------------
// DEVICE ID
//      1 byte:
//      0x00: TEST
//      0x01: 1 channel ECG
//      0x02: 2 channel ECG, SPO2
//      0x03: 3 channel ECG, P1
//      0x04: 4 channel ECG, P1, P2, SPO2
// 0x05: 2 channel ECG1, ECG2
//      0x06 - 0xff: TBD
// 0x05,        // 2 channel ECG1, ECG2

// ------------------------------------------------------------
// FIRMWARE VERSION
//      4 byte string: "1.00" or any 4 byte ascii chars
    '1', '.', '0', '0',
// ------------------------------------------------------------
// Report Interval
//      00: Reports only when new data available (not allowed in curren firmware)
//      xx: Number of MS 3,
// ------------------------------------------------------------
//      data_protocol
//
//      00: NO ACK
// 01: ACK with retry
//
    0x01,
// ------------------------------------------------------------
// REPORT BYTES
```

CONTINUE
FROM FIG. 8A

```
//      Number of bytes in data report
    10,
// ----------------------------------------------------------------
// REPORT DESCRIPTOR IDs
//       ID bytes will be used for each byte in the report
//       0x00 - ECG HIGH BYTE (vector 1)
//       0x01 - ECG LOW BYTE (vector 1)
//       0x02 - Pressure Channel 1 HIGH byte
//       0x03 - Pressure Channel 1 LOW byte
//       0x04 - Pressure Channel 2 HIGH byte
//       0x05 - Pressure Channel 2 LOW byte
//       0x06 - Pressure Channel 3 HIGH byte
//       0x07 - Pressure Channel 3 LOW byte
//       0x08 - Pressure Channel 4 HIGH byte
//       0x09 - Pressure Channel 4 LOW byte
//       0x0a - ECG HIGH BYTE (vector 2)
//       0x0b - ECG LOW BYTE (vector 2)
//       0x0c - Combo: RETRY upper nibble, Packet Count lower nibble
//       0x0D - STATUS BYTE
//       0x0e - PACKED ECG data (CAT SCANNER/MRI APP)
//       0x  - RESERVED FOR FUTURE USE
//
//       0xf9 - round robin ID byte
//       0xfa - Packet retry num
//       0xfb - checksum byte high
//       0xfc - checksum byte low
//       0xfd - LENGTH byte
//       0xfe - Packet number byte
//       0xff - mixed DATA type: used in round robin packets
// ----------------------------------------------------------------
    0x0e,     // packed ECG data byte 1
    0x0e,     // packed ECG data byte 2
    0x0e,     // packed ECG data byte 3
    0x0e,     // packed ECG data byte 4
    0x0e,     // packed ECG data byte 5
    0x0e,     // packed ECG data byte 6
    0x0e,     // packed ECG data byte 7
    0x0e,     // packed ECG data byte 8
    0x0e,     // packed ECG data byte 9
    0xff,     // mixed data type
);
```

WIRELESS TRANSMITTER

RELATED APPLICATIONS

This application is a divisional of U.S. application Ser. No. 11/206,278 filed Aug. 12, 2005, which claims the benefit under 35 U.S.C. §119(e) to U.S. Provisional Application No. 60/672,562 filed Apr. 18, 2005 and entitled "Wireless Transmitter" and to U.S. Provisional Application No. 60/671,935 filed Apr. 15, 2005 and entitled "Wireless Transmitter," the entire disclosures of each of which are hereby incorporated herein by reference for all purposes.

FIELD OF THE INVENTION

The invention relates to the field of magnetic resonant imaging and more specifically to the field of generating and transmitting amplified signals in a magnetic environment.

BACKGROUND OF THE INVENTION

Due to recent advances in Magnet Resonance Imaging (MRI), there is a growing interest in using MRI to image the heart. Because the MRI image is very sensitive to motion from slice to slice, and stopping the heart is impractical, it is necessary to accurately detect the peak of the "R" wave of the ECG signal to generate a trigger signal and thereby insure that each image slice is taken when the heart is in the same relative position.

The traditional approach has been to use non-metallic electrodes and patient leads to bring the ECG signal out of the bore of the magnet to an ECG amplifier, where processing can occur. However, due to the nature of the MRI image acquisition, the patient is subjected to an extreme static magnetic field aligned axially to the patient; moving magnetic gradients in the X, Y, and Z axis; and pulsed radio frequency (RF) fields on the order of 1500V/meter. Each of these fields presents a special challenge for the accurate detection of the "R" wave of the ECG signal.

Considering each of these in order, the static magnetic field in most MRI devices is on the order 1.5 T (tesla) or about 5000 times stronger then the earth's magnetic field. This presents the obvious problem that magnetic items near the bore of the magnet can become projectiles with the resulting patient or clinician injury. There is also a secondary problem with respect to "R" wave detection. Blood, which is conductive, exits the heart orthogonally to the static magnetic field. The movement of blood in the magnetic field results in a "magneto-homodynamic effect"; electrical currents induced in the blood. In other words, because blood is a conductor moving at right angles to the magnetic field, it is equivalent to a generator. The currents induced in the blood will distort the "T" wave, which indicates the re-polarization of the heart, making the "T" wave appear much larger in amplitude than it actually is. This can cause some "R" wave detection algorithms to detect the "T" wave instead, which will cause a shift of some 40 mS from the desired trigger point.

Yet a second problem is caused by the moving magnetic field gradients, since they will cause currents to be generated in any conductor exposed to them. The use of patient leads and cables inside the MRI bore to bring the low level (typically 1 mV) ECG signal to the amplifiers, results in artifacts in the ECG signal that could be in the same bandwidth as the ECG signal itself. The frequency and duration of the gradients are a function of the type of scan sequence being performed, and cannot be filtered effectively with a fixed filter sequence.

Finally, the pulsed RF fields present the greatest challenge to effective ECG detection. The RF pulse is usually a SINC ((Sin x)/x) pulse centered at 64 MHz for a 1.5 T system and is about 5 mS in duration. The repetition rate for the pulses is from tens of Hz to several KHz. The fields are generated within the magnet bore and the coils generating the pulses are excited with 50KW of RF power creating a field strength that often exceeds 1500V/M. These RF pulses, because of the very high power, are a source of significant patient risk when the patient leads are exposed to the fields. A wire, looped around on itself, will appear as a short circuit through the insulator. This in turn will allow for the generation of eddy currents in the loop, which will then heat the wire, often enough to cause third degree burns. To limit the generation of the eddy current, the patient leads must have a distributed impedance of about 10Kohms/ft. The result is that the RF pulses in addition to potentially generating heat in the electrodes create artifacts in the ECG amplifiers at the repetition rate used in a particular scan. The high impedance of the patient leads also increases the electrical noise of the system.

The traditional approach employed by systems presently on the market involve using carbon fiber electrodes attached to high impedance patient leads to bring the low level (1 to 5 mV) ECG signal out of the magnet bore. Once out of the bore, the high impedance leads connect to a conventional patient cable, which then supplies the signal to the ECG amplifiers. The ECG amplifiers typically are located in a RF sealed enclosure outside the magnet and often as far as 15 feet away. Because the signal is heavily contaminated with MRI related artifacts, a huge amount of post processing is required to clean the signal enough to detect the "R" wave. This process is usually DSP (Digital Signal Processing) based, and often requires the use of filters that can change parameters quickly over time to reduce artifacts. These are generally referred to as adaptive filters. Presently, no manufacturer has a solution which can produce a clean ECG waveform under all scan conditions.

SUMMARY OF THE INVENTION

In one aspect the invention relates to a magnetic field tolerant amplifier having an amplifier stage, a differential to single-ended output amplifier stage and a first and second delay line. The amplifier stage includes a pair of differential input terminals and a pair of differential output terminals. The differential to single ended output amplifier stage includes a pair of differential input terminals and an output terminal. Each of said differential input terminals of the differential to single ended output amplifier stage is in electrical communication with a respective differential output terminal of said amplifier stage. The first and second delay line each has an output terminal. Each output terminal of said first and second delay line is in electrical communication with a respective input terminal of the pair of differential input terminals of the amplifier stage. In one embodiment the magnetic field tolerant amplifier further includes a plurality of amplifier stages. Each amplifier stage includes a pair of differential input terminals and a pair of differential output terminals. Each of the differential output terminals of one of the plurality of amplifier stages is in electrical communication with a respective differential input terminal of another of the plurality of amplifier stages through a respective high pass filter.

In a second aspect the invention relates to a magnetic gradient cancellation delay line including two coils connected in series at a junction. A capacitor, having a first terminal and a second terminal, is connected such that first terminal of the capacitor is in electrical communication with the junction and the second terminal of the capacitor is in electrical communication with ground. Each of the coils is non-inductively wound to cancel induced currents from a magnetic gradient.

In a third aspect the invention relates to a patient lead including a flexible circuit substrate having a flexible conductor having distributed impedance.

In a fourth aspect the invention relates to a wireless transceiver system including an RF cancellation delay line circuit having a pair of output terminals; an amplifier stage having a pair of differential input terminals and a pair of differential output terminals; a differential to single ended output amplifier stage; an A/D converter having an output terminal and having an input terminal; an RF transceiver having an output terminal and having an input terminal and an antenna in electrical communication with the output terminal of the RF transceiver.

Each of the pair of differential input terminals of the amplifier stage is in electrical communication with a respective output terminal of the of RF cancellation delay line circuit. The differential to single ended output amplifier stage includes a pair of differential input terminals and an output terminal. Each of the differential input terminals of the differential to single ended output amplifier stage is in electrical communication with a respective one of the differential output terminals of the amplifier stage. The input terminal of the A/D converter is in electrical communication with the output terminal of the differential to single ended output amplifier stage. The input terminal of the RF transceiver is in electrical communication with the output terminal of said A/D converter.

In yet another aspect, the invention relates to a wireless transceiver system. The system includes a first transceiver sub-system including an RF cancellation delay line having a pair of output terminals; an amplifier stage including a pair of differential input terminals and a pair of differential output terminals; a differential to single ended output amplifier stage including a pair of differential input terminals and an output terminal; an A/D converter having an output terminal and having an input terminal; an RF transceiver having an output terminal and having an input terminal; and an antenna in electrical communication with the output terminal of the RF transceiver. The wireless transceiver system also includes a second transceiver subsystem having a second RF transceiver having an input terminal and an antenna in electrical communication with the input terminal of the second RF transceiver.

Each pair of differential input terminals of the amplifier stage is in electrical communication with a respective output terminal of the pair of RF cancellation delay line output terminals. Each of the differential input terminals of the differential to single ended output amplifier stage is in electrical communication with a respective one of the differential output terminals of the amplifier stage. The input terminal of the A/D converter is in electrical communication with the output terminal of the differential to single ended output amplifier stage. The input terminal of the RF transceiver is in electrical communication with the output terminal of the A/D converter.

In still yet another aspect, the invention relates to a method for transmitting a signal in a magnetic environment. The method includes the steps of providing said signal to one input terminal of a differential amplifier, delaying said signal 180 degrees using a delay line comprising a pair of non-inductively wound coils; and providing said signal delayed by 180 degrees to a second terminal of said differential amplifier.

BRIEF DESCRIPTION OF THE DRAWING

These and further aspect of the invention can be better understood with reference to the attached specification and drawings in which.

DESCRIPTION OF A PREFERRED EMBODIMENT

Figure 1:
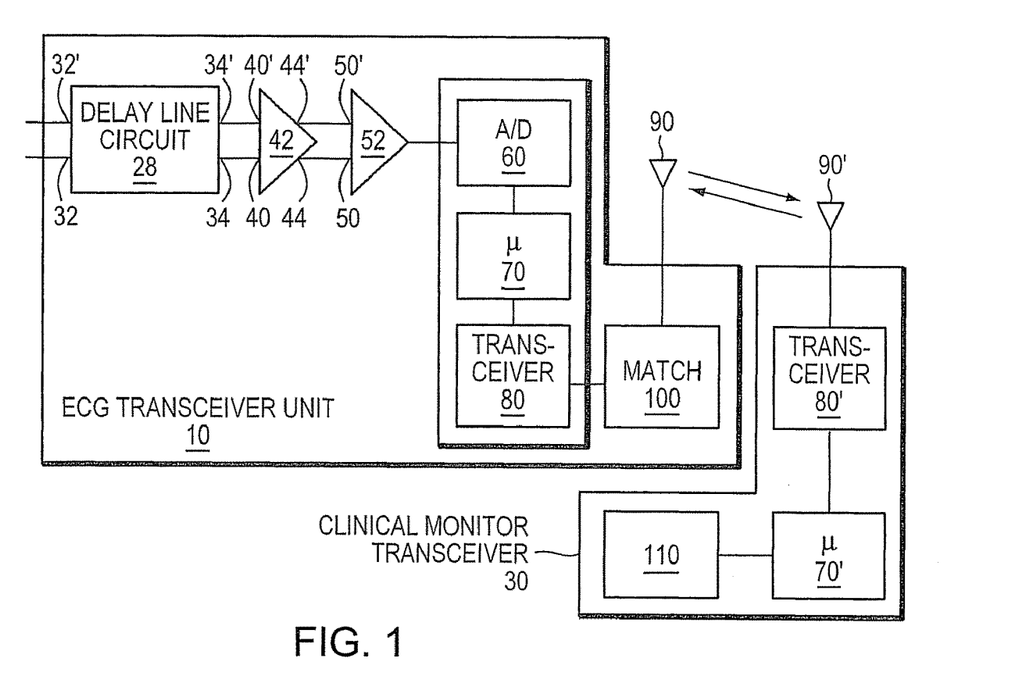
FIG. 1 is a block diagram of an overview of an embodiment of the system of the invention.

In brief overview and referring to FIG. 1, an embodiment of the wireless system of the invention includes a patient ECG transceiver unit 10 and a clinician monitor transceiver unit 20. The patient ECG transceiver unit 10 includes a delay line circuit 28 which receives two ECG signals at its input terminals 32, 32' and provides, at its output terminals 34, 34' a pair of delayed ECG signals each mixed with its corresponding input signal. This mixed signal is applied to the input terminals 40, 40' of a differential amplifier stage 42. The output terminals 44, 44' of the differential amplifier stage 42 provide the input signals to the input terminals 50, 50' of a differential to single output amplifier stage 52. The output signal of the differential to single-output amplifier stage is the input signal to an A/D converter 60. The digital output of the A/D converter 60 is the input signal to a processor 70. The processor 70 provides the encoded output signal to a transceiver 80 for transmission by the transceiver 80 to an antenna 90 through a matching unit 100.

The clinician monitor transceiver unit 20 includes an antenna 90 which is in connected to a transceiver 80', which in one embodiment is the same transceiver 80 that is used by the ECG transceiver unit 10. The signal from the transceiver 80' is sent to processor 70', which in one embodiment is the same processor that is used in the ECG transceiver unit 10. The output of the processor 70' is used to drive a display 110.

In operation, the ECG transceiver unit 10 has the transceiver portion initially in listen mode at a predefined frequency. The clinician monitor transceiver 20 begins by broadcasting on this predetermined predefined frequency what frequency it will be transmitting and receiving on. The ECG transceiver, at time zero, will operate in receive mode on channel 0 looking for a response. It will never transmit on any channel until a signal is detected from the clinician monitor transceiver. The ECG transceiver 10 then switches itself to the transmit and receive frequency of the clinician monitor transceiver 20. At this point the clinician monitor transceiver 20 instructs the ECG transceiver to collect and transmit ECG data. After each transmission from the ECG transceiver 10, the clinician monitor transceiver 20 issues an acknowledgement (ACK). If the ECG transceiver fails to receive an ACK it returns to listen mode to determine if the clinician monitor transceiver has changed transmission frequencies.

In more detail, with the wireless transceiver, it is not possible to filter out the 64 MHz RF of the pulse MRI coils, since there is no earth ground to which the RF energy can be shunted. Furthermore, the entire circuitry is exposed to the RF fields and therefore is saturated with RF energy. A traditional approach to removing the RF field is to use absorptive material, such as ferrite. Although non-magnetic ceramic based ferrite is available, it will not provide any RF attenuation within the static magnetic field of MRI device because the ceramic will magnetically saturate. Therefore neither filtering nor absorption is an option.

Figure 2:
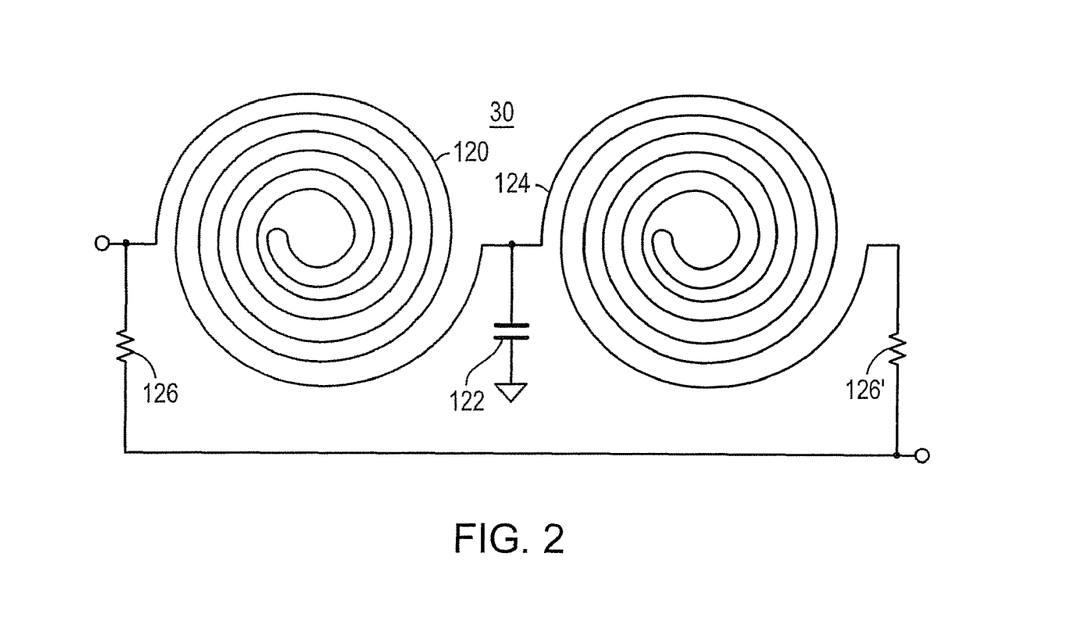
FIG. 2 is a block diagram of an embodiment of the delay line circuit of FIG. 1.

Referring to FIG. 2, in one embodiment cancellation is used to remove the effects of the pulsed RF fields. To cancel the effects of the pulses, a 7.8 nS delay line is used for each ECG input signal. A 7.8 nS delay line will shift the 64 MHz RF carrier by 180 degrees. If the delayed signal is then mixed with the original signal, the RF carrier signal will cancel itself. In this embodiment this is accomplished by winding a PC board trace of length 9.5 inches into a coil 120, and placing a 22 pF capacitor 122 to ground. Another coil 124 of 9.5 inches total length is placed the next PC layer and connected to the first coil. This configuration provides the necessary 7.8 nS delay. The output signal of the delay line and the input were mixed across two 50K Ohm resistors 126, 126'. The resulting circuit provided better then 40 dB of 64 MHz attenuation in an RF test chamber.

Figure 3:
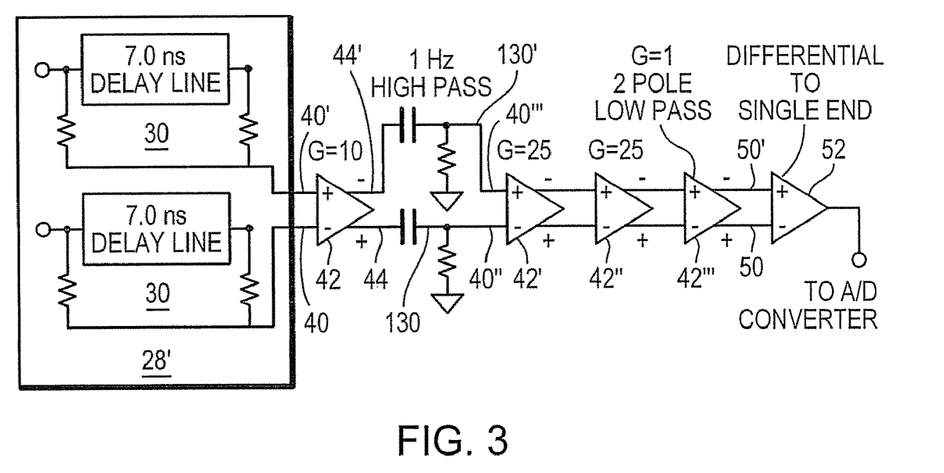
FIG. 3 is a detailed block diagram of an embodiment of a magnetic field tolerant amplifier of the invention.

Referring now to FIG. 3, the remainder of an embodiment of a magnetic field tolerant amplifier is shown. Each of the delay lines 30 is connected to one of the differential input terminals 40, 40' of a differential amplifier 42. Each of the output terminals 44, 44' of the differential amplifier 42 is connected to the input terminals 40", 40'" of the next differential amplifier stage 42' of the amplifier chain through a high pass RC filter 130, 130'. In one embodiment four differential amplifiers 42, 42', 42", 42'" make up the amplifier chain with output terminals of the differential amplifier of each stage connected directly to the input terminals of the subsequent differential amplifier. In the embodiment shown the chain has gain factors of ten, two and one half, twenty five and one. The output terminals of the last stage differential amplifier 43'" are connected to the input terminals 50, 50' of a differential to single ended amplifier 52.

Figure 4:
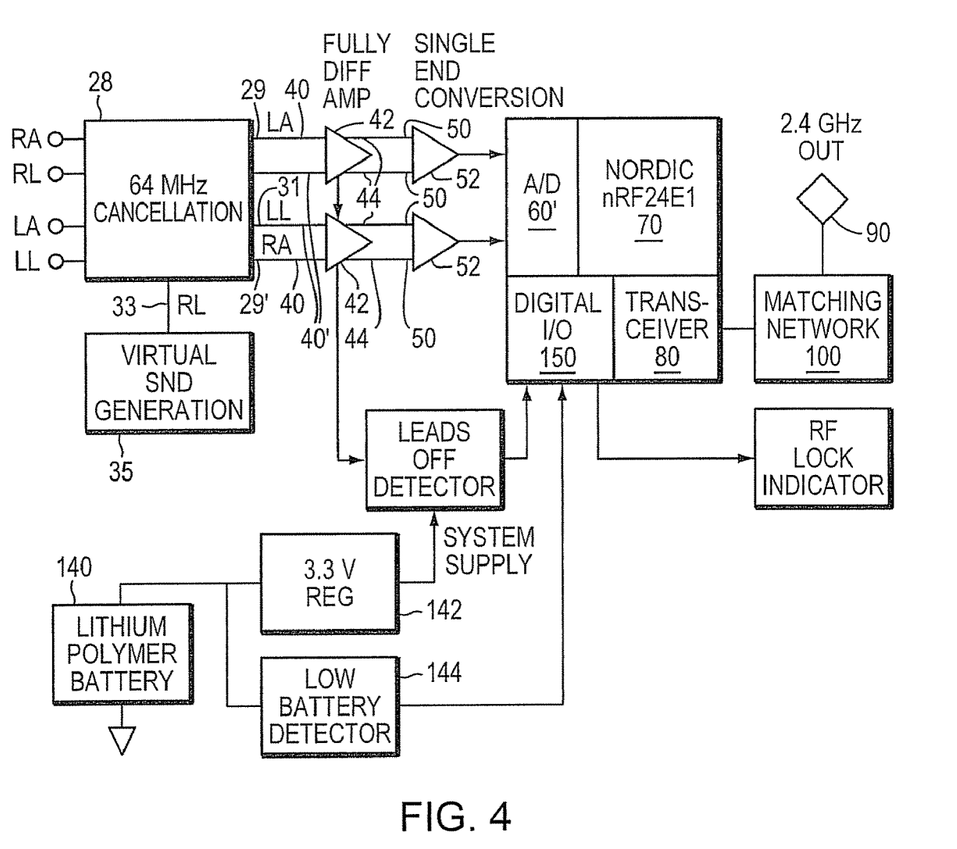
FIG. 4 is detailed block diagram of an embodiment of a patient transceiver of the invention.

Referring to FIG. 4, in still more detail an embodiment of an ECG transceiver unit 10 is shown. In the embodiment shown the delay line circuit 28 is constructed from four delay lines. The input of each delay line 30 (not shown) is connected to a respective ECG lead. The output of the delay line corresponding to the left arm 29 and right arm 29' respectively is connected to a respective input (generally 40) of a respective differential amplifier (generally 42). The output of the delay line corresponding to the left leg 31 is connected to the other input 40' of both differential amplifiers 42. The delay line corresponding to the right leg 33 is connected to a virtual ground generator 35 which is set at 1.65V or half the supply voltage. The respective output terminals (generally 44) of each respective differential amplifier 42 are connected to the input terminals (generally 50) of a respective differential to single-ended output amplifier (generally 52). Each output terminal of the respective differential to single-ended amplifier (generally 52) is connected to an input terminal to a respective A/D converter (generally 60).

In the embodiment shown, the A/D converter 60 is part of a single chip A/D-processor-transceiver made by Nordic Semiconductor ASA (Tiller, Norway). This device, the nRF24E1 is a 2.4 GHz RF transceiver with an embedded 8051 micro-controller 70 and a multi-channel 12 bit A/D converter. Although this device has a clock based processor, the die for the processor is created from 0.13 micron technology, and operates at 1.9 volts. The device has no external bus. Basically, the device is a very small piece of silicon operating with very small voltages. Therefore the device emits very little energy in the clock edges thereby reducing the interference with the ECG signals.

The A/D converter 60 has enough data acquisition resolution to handle adult ECG data. The transceiver portion 80 of the chip can be set to operate on any one of 80 frequencies in the 2.4 GHz ISM band. The part is packaged in a 6×6 mm package and is non-magnetic. The components of the device are powered a non-magnetic battery 140 in the form of a lithium polymer, which provides 3.7V at 650 mA hours. Additional circuits such as a 3.3 V regulator 142 which provides a regulated voltage to the components and a low battery detector 144 which monitors the battery charge are also included.

The chip also includes an integral digital I/O portion 150 which receives input from the low battery detector 144 and the leads-off detector 154 which receives its input from a differential amplifier 42. In this manner the processor 70 can be notified of error conditions and can broadcast this information to the clinician monitor transceiver 20.

Looking at the operation in more detail, the protocol is an ultra low power 2.4 GHz protocol designed for short distance (less then 30 meters) highly deterministic transmission of physiological data from an on patient instrumentation device, the ECG transceiver, to a single receiving and display device, the clinician monitor transceiver. Unlike other ISM band protocols, this protocol is not designed to operate within a network, but in a point to point configuration. As discussed above, it is the function of the clinician monitor transceiver to display the data and provide a bridge to a traditional network, such as 10BaseT or 802.11 network, if network transmission is desired. By unburdening the protocol from the need to operate within a network, greater robustness and absolute timing repeatability is achieved.

A feature of the protocol is automatic discovery between any number of ECG transceivers and up to seventy-nine clinician monitor transceivers within a defined operating environment. The nRF24E1 2.4 GHz transceiver chip with embedded 8051 micro-controller generates a 1 MB burst to transmit up to twenty bytes of data in a packet. The chip employs a sixteen bit CRC for improved data integrity. The transceiver chip provides for eighty discrete channels within the 2.4 GHz ISM band, permitting the ECG transceiver initially to be frequency neutral, and adapting to the frequency of any clinician monitor transceiver. With this capability a patient could travel from one monitoring environment to another, and the ECG transceiver would automatically lock onto the closest unused clinician monitor transceiver.

For example, in an imaging environment, patient setup could take place in a dedicated room for attaching the ECG leads and transmitter. In this room would be a clinician monitor transceiver, and this would be configured to transmit and receive a specific predefined frequency. The ECG transceiver transmitter, upon powering up, would listen at a predetermined frequency (the neutral frequency) and then discover the actual transmission frequency of the clinician monitor transceiver and switch to receive it. This would then allow the clinician to verify the quality of the ECG signal while any medication is given. The patient would then leave the setup room and travel to the imaging room, thus losing the communications ability with the clinician monitor transceiver in the setup room. The ECG transceiver would then reset its receive frequency to the neutral frequency again. In the imaging room, there would be another clinician monitor transceiver. Again the ECG transceiver would discover the transmission frequency of this new clinician monitor, set itself to receive this frequency and transmit the ECG data.

It is possible to extend the number of devices which can operate within a given clinical zone from seventy nine to about five million by including a sixteen bit address assignment to each clinician monitor transceiver (equal to seventy nine channels times 65,536). In such an embodiment, multiple clinician monitor transceivers could operate on the same channel, but would be discriminated by their sixteen bit address. Such an approach is reasonable for implementations requiring low data rates. That is, rates lower than that required by, for example; MRI cardiac gating, CAT scanner cardiac gating and OR monitoring.

This is due to the fact that with address discrimination there will be a certain number of radio packet collisions which will require the need for re-transmissions. Furthermore, the transceivers require additional time to decode the packet to determine if the address matches the assignment. The net effect is a possible reduction in bandwidth below what is required for the MRI and CAT gating and OR monitoring functions. It should be noted however, that in the case of using the ECG signal for cardiac gating of an MRI or CAT scan, if the pre-processing of the signals is moved to the processor in the ECG transceiver on the patient, and if a deterministic cardiac trigger is not needed, then the data flow is significantly reduced and the use of address discrimination is reasonable.

The combination or protocol and hardware features result in extremely low power consumption; about 13 mW of power when transmitting. The transceivers can send about 100K baud of data in one direction with a real time delay of 3 mS; enough for six physiological parameters. The protocol allows for the re-transmission once of each packet if dropped. It also contains information about signal strength, ECG transceiver serial number, and battery life. The protocol also allows for about fifty kilobaud of information to be sent from the clinician monitor transceiver back to the ECG transceiver.

In more detail, the ECG and clinician monitor transceivers have four operational states. In the first state, State_0, the ECG transceiver is set to the neutral frequency, the frequency at which the ECG transceiver listens for the presence of a clinician monitor transceiver. The clinician monitor transceiver at this point is broadcasting a low power RF signal (termed a beacon) out every 10 mS on the neutral frequency (channel 0) indicating which channel from one to seventy-nine the clinician monitor transceiver has been assigned and will be receiving on. Each clinician monitor transceiver within an operating environment has a unique channel assignment. After sending the beacon, the clinician monitor transceiver switches to the assigned channel and listens for a response from the ECG transceiver. If no response is received, then the clinician monitor transceiver transmits a beacon again and then again listens for a response. This continues until a response is found. All beaconing happens at −20 dBM, as to limit the coverage area to about three meters.

Once the clinician monitor transceiver and the ECG transceiver have established the transmit and receive frequency, the ECG and clinician monitor transceivers are in State_1. In this state, the ECG transceiver is switched to the operating channel indicated to by the beacon message from the clinician monitor transceiver. The ECG transceiver sends an "ACK" or acknowledgement message. The clinician monitor transceiver transmits an "RFD" or request for descriptor to the ECG transceiver. The ECG transceiver responds with another "ACK". From here on, any received message in either direction will be responded to with an "ACK".

Figure 5:
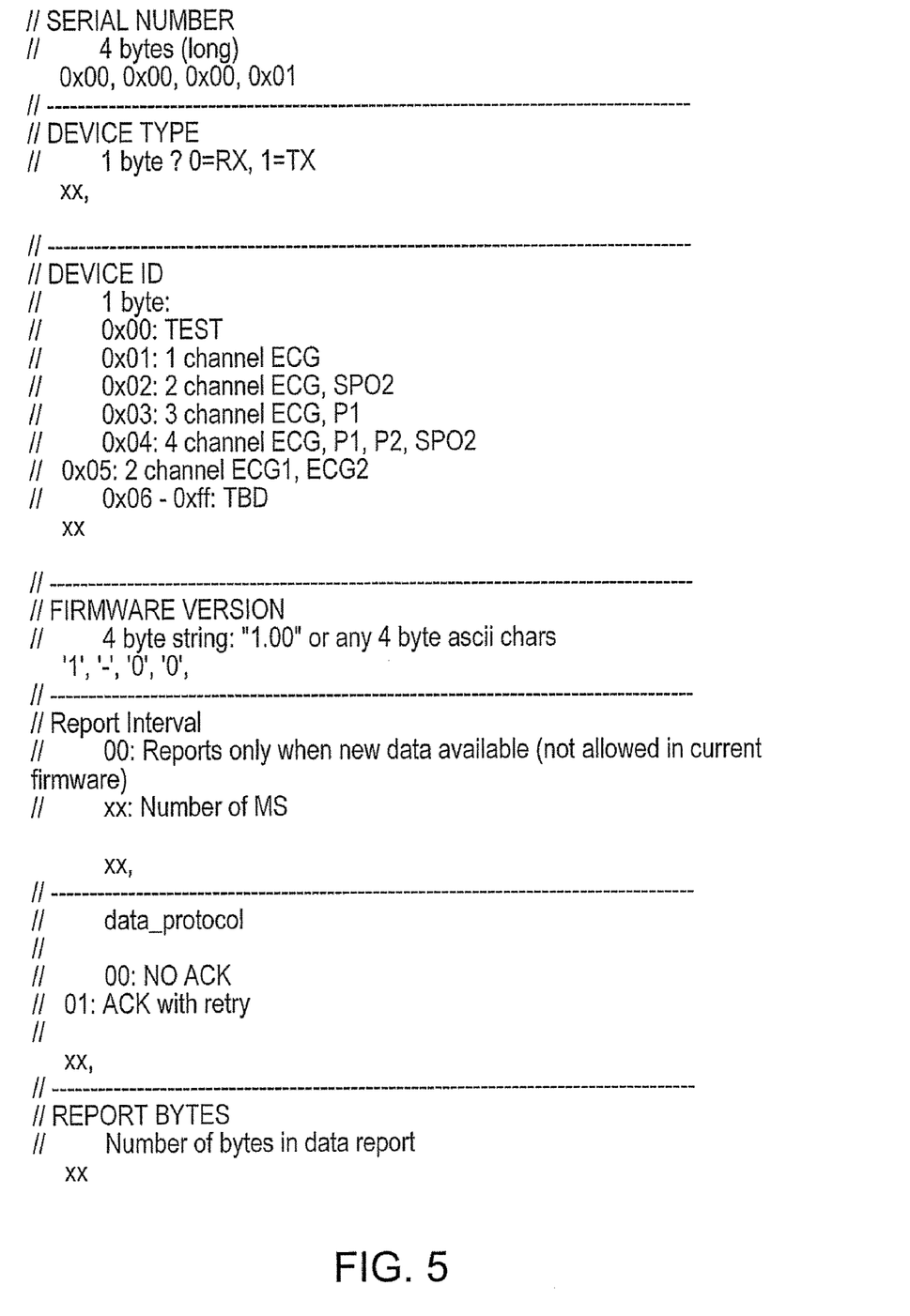
FIG. 5 is an embodiment of a datastructure transmitted during State_2 according to an embodiment of the protocol of the invention.

At this point the transceivers have entered State_2. This is the discovery state of the system. The ECG transceiver will now tell the clinician monitor transceiver about itself. (FIG. 5) Each ECG transceiver has a hard coded unique thirty two bit serial number in read only memory which is also displayed on the ECG transceiver's enclosure as a six decimal digit value. The ECG transceiver now sends this serial number to the clinician monitor transceiver, and awaits the "ACK" message from the clinician monitor transceiver. All communications now occurs at full RF power or 0 dBM. Every message received from the ECG transceiver is acknowledged by the clinician monitor transceiver with an "ACK" message. In this state, if the ECG transceiver receives no "ACK" from the clinician monitor transceiver, it will re-transmit its previous message thirty two times, and after which it will assume that it is no longer in contact with the clinician monitor transceiver with which it had been in contact and looks for another clinician monitor transceiver by returning to State_0.

If the clinician monitor device has received a response from an ECG transceiver that is compatible, the clinician monitor transceiver transmits a "GTD" or go-to-data message and the ECG transceiver returns an "ACK". Every ECG transceiver includes a bicolor red-green led to indicate the state it is operating in; red for communications with the clinician monitor transceiver (termed a "no-lock") and green for communications with the clinician monitor transceiver (termed a "lock"). At this point the ECG transceiver lights the green LED, the transceivers enter State_3 and patient data transmission begins. If the clinician monitor transceiver is not expecting to communicate with the transmitting ECG transceiver, the clinician monitor transceiver sends a "DNC" or device-not-compatible message. The ECG transceiver then sends an "ACK" and both devices return to State_0. An ECG transceiver, having received a "DNC", will delay for 15 seconds before entering State_0, to allow another local ECG transceiver, if present, a chance to lock onto the clinician monitor transceiver.

In State_3 the continuous data transfer takes place. The basic cycle time is three mS, in which a data packet of up to nineteen bytes is sent from the ECG transceiver to the clinician monitor transceiver, and an "ACK" is sent from the clinician monitor transceiver back to the ECG transceiver. All this takes about 1.2 mS, which leaves enough time for the ECG transceiver to re-transmit the last packet if no "ACK" is received within 500 uS of sending the packet. This data transmission sequence is repeated as long as the ECG transceiver receives an "ACK", and the system allows for the re-transmission of one missed packet. Due to the real time nature of the signals being transmitted and the fact that the system must be deterministic, after retransmitting the missed packet, the system must move on to the next data point if the re-transmitted packet is also lost. At the clinician monitor missed data points are interpolated. In most cases two or three missed data points in a row will not affect the ability to process the signal. If the clinician monitor transceiver goes for more then 5 seconds without receiving an "ACK", it will then return to State_0.

Although the system has been described in terms of transmitting ECG data, the ECG transceiver can be used to transmit a wide variety of patient data to a clinician monitor transceiver. Thus various signals transmitted from the patient transceiver can be used to trigger or gate MRI or gamma cameras or provide operating room data for real-time monitoring of the patient. The hardware and protocol were designed to handle a wide variety of real time data, both pre-processed as for example the digital data stream from a pulse oximeter module (eg: a Nellcor MP-100), or a digital stream representing an analog waveform to be processed in the clinician monitor transceiver. Three different data structures are now described as examples of data that may be transmitted in State_3.

Figure 6A:
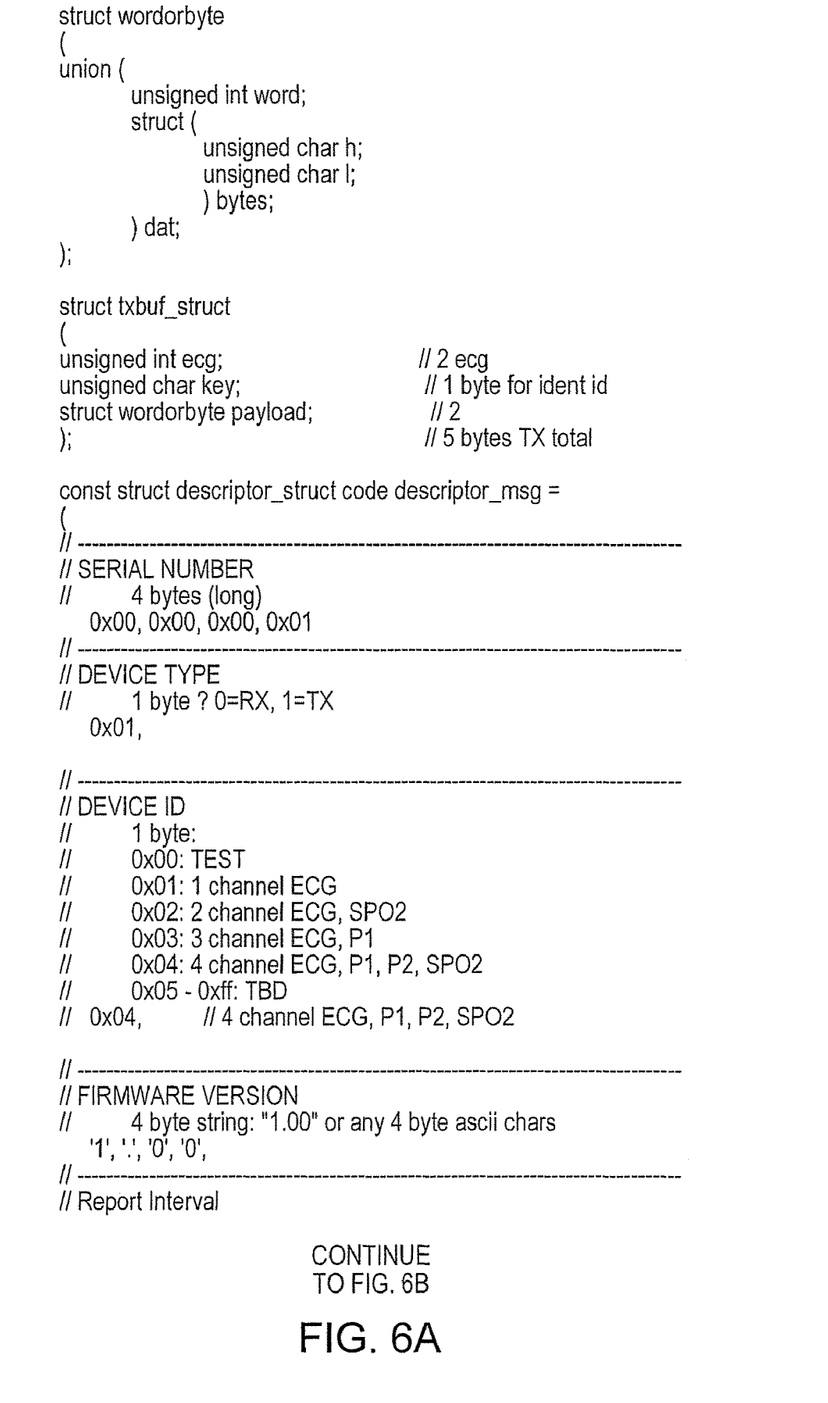
FIG. 6 is an embodiment of a datastructure transmitting operating room data according to an embodiment of the protocol of the invention.
Figure 6B:
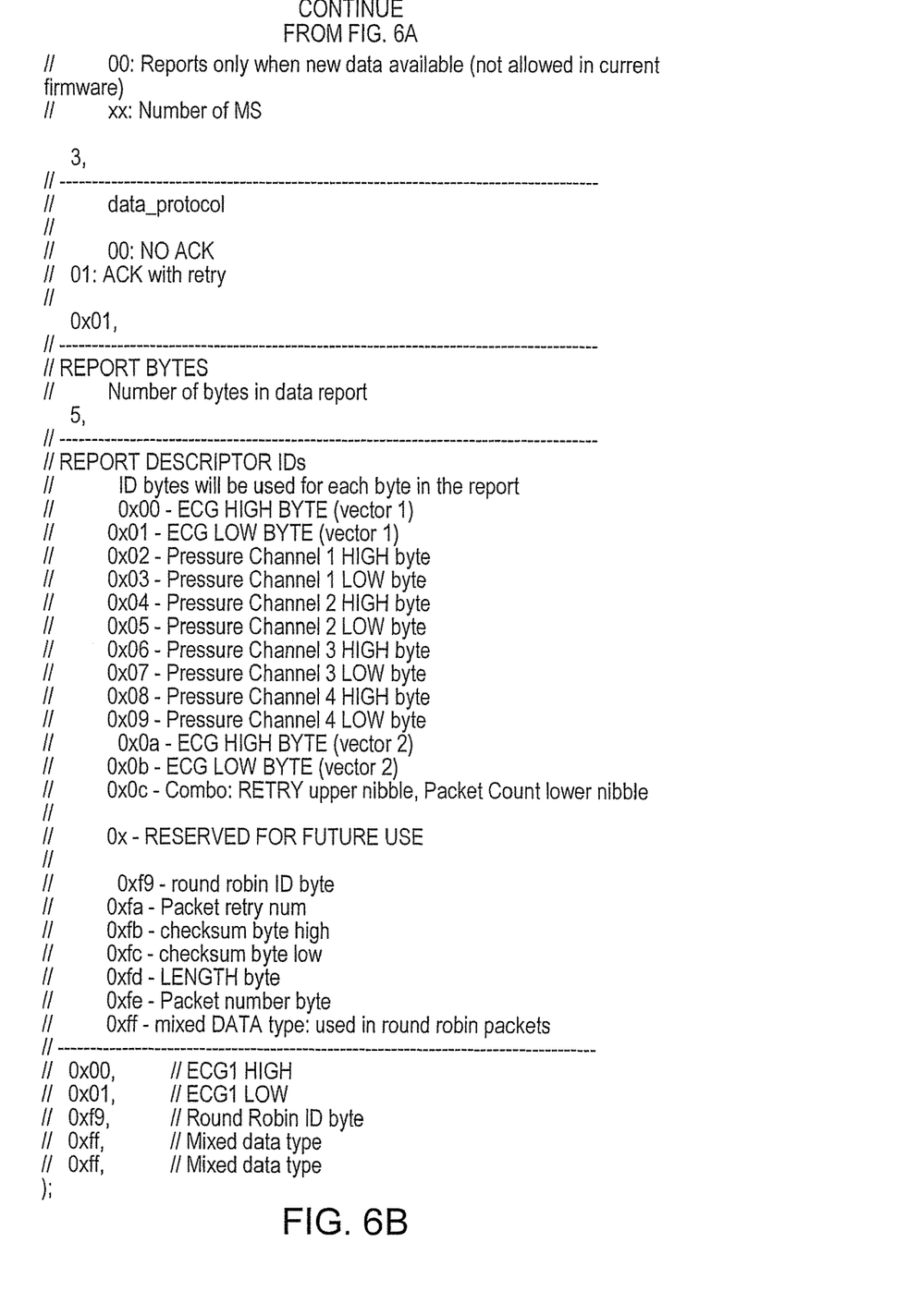
Figure 7A:
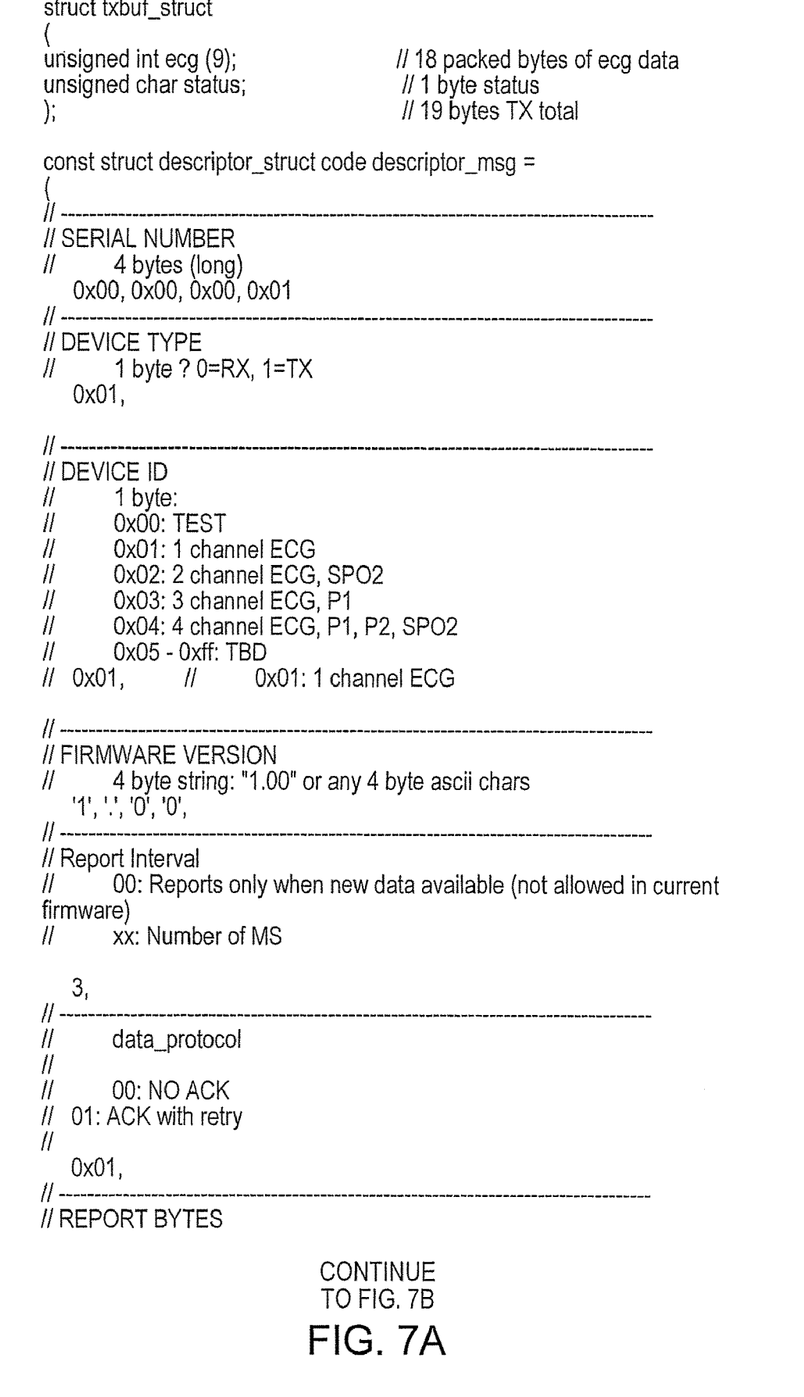
FIG. 7 is an embodiment of a datastructure transmitting CAT scanner and gamma camera triggering data according to an embodiment of the protocol of the invention.
Figure 7B:
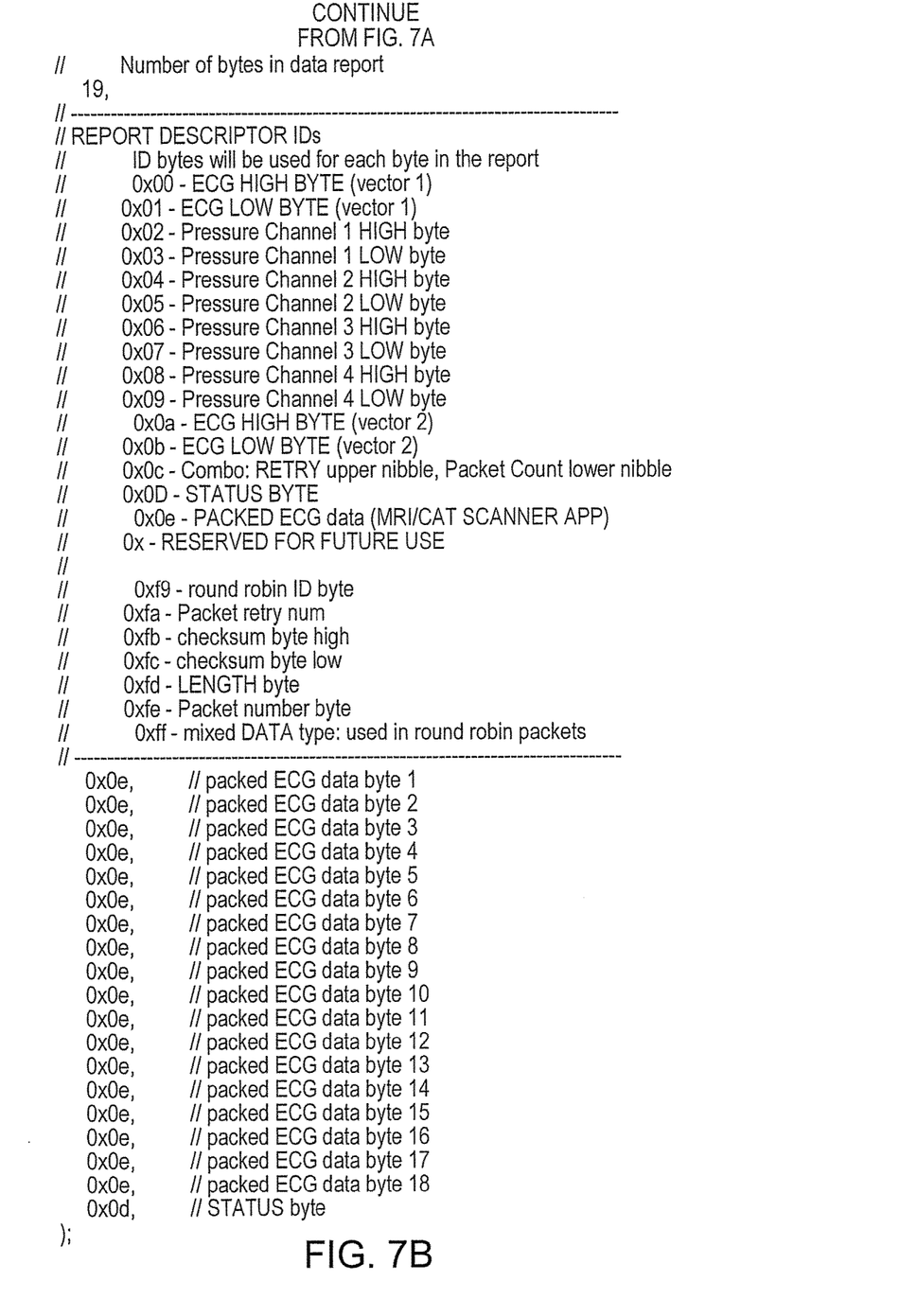
Figure 8A:
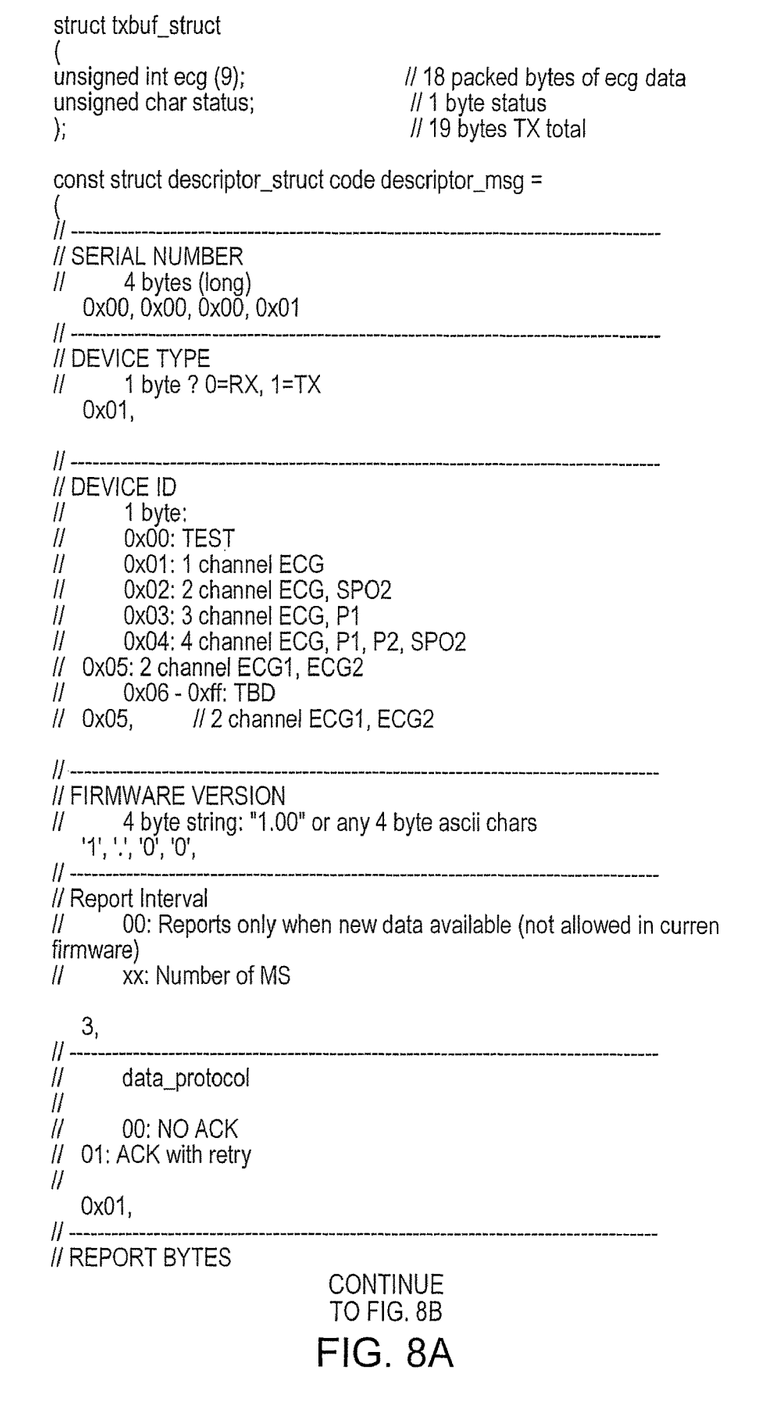
FIG. 8 is an embodiment of a datastructure transmitting MRI triggering data according to an embodiment of the protocol of the invention.
Figure 8B:
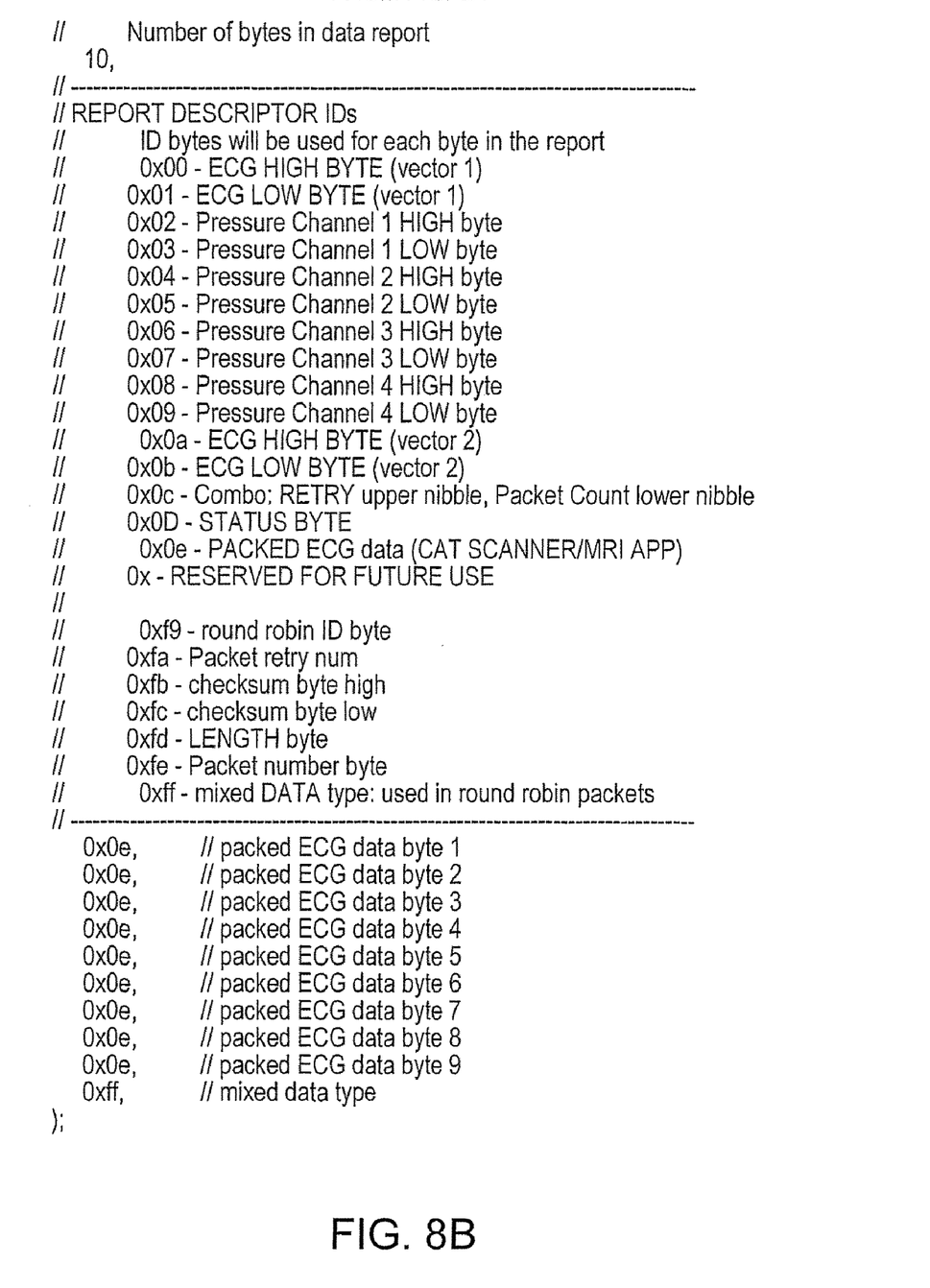

The first application (FIG. 6) is for on-patient Operating Room monitoring, in which 4 parameters are sent; one twelve bit ECG vector at three mS sampling period, two to twelve bit Invasive Pressure signals at a 25 mS sample rate, and the digital stream from the Nellcor MP-100 module. The second application (FIG. 7) is for CAT scanner and gamma camera triggering, in which a single ECG vector is transmitted with twelve bits of amplitude resolution at a 250 uS sampling period. The third application (FIG. 8) is for MRI triggering, in which two ECG vectors are transmitted with twelve bits of amplitude resolution at a 1 mS sampling period.

Figure 9:
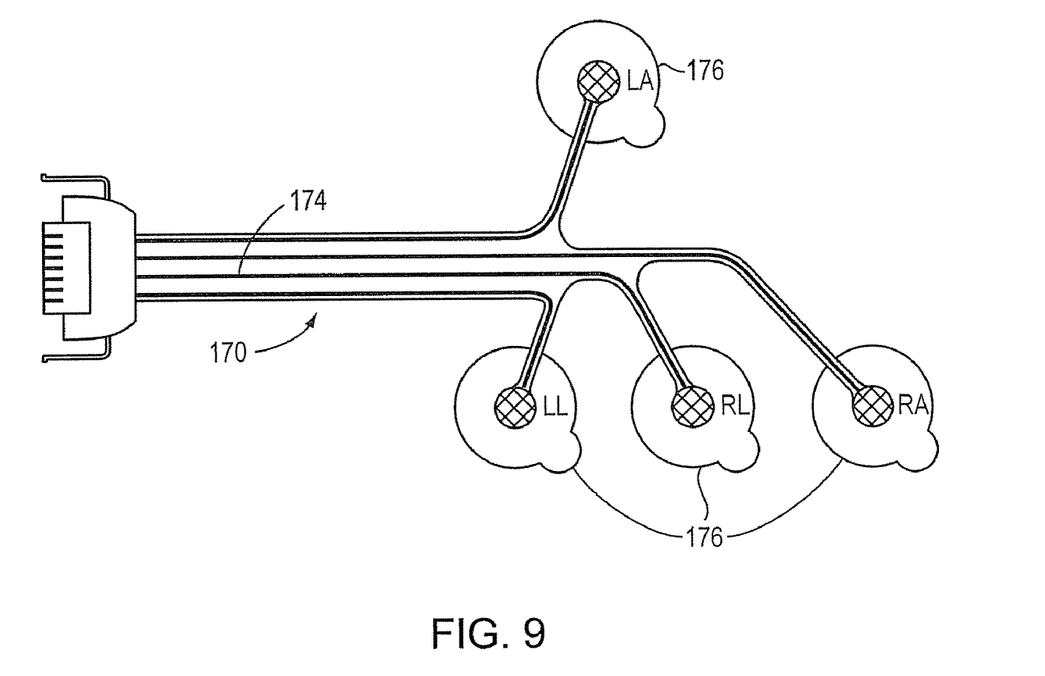
FIG. 9 is a diagram of a set of patient electrodes constructed in accordance with the invention.

Referring to FIG. 9, an embodiment of a set of patient leads 170 is shown. The electrode (generally 174) leads are printed on a flexible substrate with conductive ink. In one embodiment the substrate is a polyester base such as Kaptan and the ink is a carbon ink. The carbon ink provides a distributed impedance. The individual electrode pads (generally 176) are made of silver.

The embodiments shown are exemplary and one skilled in the art will realize that modifications and changes may be made without deviating from the spirit of the invention. The invention is intended to be limited only by the scope of the attached claims.

I claim:

1. A wireless transceiver system for use in a time varying radio frequency field, said time varying radio frequency field having a predetermined frequency, the wireless transceiver system comprising:
    a first and second radio frequency delay line, each of said first and second radio frequency delay lines having a delay line output terminal and a delay input terminal, said delay line input terminal of each radio frequency delay line configured for connection to an input signal source, said input signal source having an input signal comprising a signal of interest and a component resulting from the effects of a radio frequency field;
    a radio frequency cancellation delay line circuit comprising:
        the first and second radio frequency delay lines,
        each radio frequency delay line output terminal in communication with a respective one of a pair of radio frequency cancellation delay line circuit output terminals and each radio frequency delay line input terminal in communication with a respective one of a pair of radio frequency cancellation delay line circuit input terminals;
    an amplifier stage, said amplifier stage comprising a pair of differential input terminals and a pair of differential output terminals; each of said pair of differential input terminals of said amplifier stage in electrical communication with a respective output terminal of said pair of radio frequency cancellation delay line stage output terminals;
    a differential to single ended output amplifier stage, said differential to single ended output amplifier stage comprising a pair of differential input terminals and an output terminal, each of said differential input terminals of said differential to single ended output amplifier stage in electrical communication with a respective one of said differential output terminals of said amplifier stage;
    an analog to digital converter having an output terminal and having an input terminal, said input terminal of said analog to digital converter in electrical communication with said output terminal of said differential to single ended output amplifier stage;
    an radio frequency transceiver having an output terminal and having an input terminal, said input terminal of said radio frequency transceiver in electrical communication with said output terminal of said analog to digital converter; and
    an antenna in electrical communication with said output terminal of said radio frequency transceiver,
    wherein each said first and second radio frequency delay lines is configured to produce an 180 degree phase shift at the predetermined frequency in the component of said input signal resulting from the effects of the radio frequency field at said radio frequency delay line output terminal to thereby cancel the component of the input signal resulting from the effects of the radio frequency field having the predetermined frequency and leave the signal of interest of the input signal substantially unaffected.

2. The Wireless transceiver system of claim 1 further comprising a processor in electrical communication with said analog to digital converter and said transceiver.

3. A wireless transceiver system for use in a time varying radio frequency field, said time varying radio frequency field having a predetermined frequency, the wireless transceiver system comprising:
    a first transceiver sub-system comprising:
        a first and second radio frequency cancellation delay line each of said first and second radio frequency delay lines having a delay line input terminal and a delay line output terminal, said delay line input terminal configured for connection to an input signal source, the input signal source having an input signal comprising a signal of interest and a component resulting from effects of a radio frequency field;
        an amplifier stage, said amplifier stage comprising a pair of differential input terminals and a pair of differential output terminals; each of said pair of differential input terminals of said amplifier stage in electrical communication with a respective output terminal said pair of radio frequency cancellation delay line output terminals;
        a differential to single ended output amplifier stage, said differential to single ended output amplifier stage comprising a pair of differential input terminals and an output terminal, each of said differential input terminals of said differential to single ended output amplifier stage in electrical communication with a respective one of said differential output terminals of said amplifier stage;
        an analog to digital converter having an output terminal and having an input terminal, said input terminal of said analog to digital converter in electrical communication with said output terminal of said differential to single ended output amplifier stage;
        a radio frequency transceiver having an output terminal and having an input terminal, said input terminal of said radio frequency transceiver in electrical communication with said output terminal of said analog to digital converter;
        an antenna in electrical communication with said output terminal of said radio frequency transceiver; and
    a second transceiver subsystem comprising;
        a second radio frequency transceiver having an input terminal and an output terminal; and an antenna in electrical communication with said input terminal of said second radio frequency transceiver, wherein each said first and second radio frequency delay lines is configured to produce an 180 degree phase shift at the predetermined frequency in the component of said input signal resulting from the effects of the radio frequency field at said radio frequency delay line output terminal to thereby cancel the component of the input signal resulting from the effects of the radio frequency field having the predetermined frequency and leave the signal of interest of the input signal substantially unaffected.

* * * * *